(12) United States Patent
Lachner

(10) Patent No.: US 6,893,935 B2
(45) Date of Patent: May 17, 2005

(54) SEMICONDUCTOR COMPONENT AND FABRICATION METHOD

(75) Inventor: Rudolf Lachner, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/228,241

(22) Filed: Aug. 26, 2002

(65) Prior Publication Data

US 2003/0030094 A1 Feb. 13, 2003

Related U.S. Application Data

(63) Continuation of application No. PCT/DE01/00465, filed on Feb. 7, 2001.

(30) Foreign Application Priority Data

Feb. 24, 2000 (DE) .......................... 100 08 573

(51) Int. Cl.[7] .............................................. H01L 21/20
(52) U.S. Cl. ...................... 438/396; 438/240; 438/253; 438/256; 257/303; 257/310
(58) Field of Search ................................ 438/396–398; 257/303–304, 306, 311

(56) References Cited

U.S. PATENT DOCUMENTS

| | | | |
|---|---|---|---|
| 5,391,905 A | | 2/1995 | Yamazaki |
| 5,563,762 A | | 10/1996 | Leung et al. |
| 5,644,151 A | | 7/1997 | Izumi et al. |
| 5,712,813 A | * | 1/1998 | Zhang .......................... 365/149 |
| 5,929,473 A | * | 7/1999 | Nishihori et al. ........... 257/277 |
| 6,004,841 A | | 12/1999 | Chang et al. |
| 6,017,788 A | | 1/2000 | Jenq |
| 6,025,226 A | | 2/2000 | Gambino et al. |
| 6,432,769 B1 | * | 8/2002 | Fukuda et al. ............... 438/244 |
| 6,504,202 B1 | * | 1/2003 | Allman et al. ............... 257/303 |
| 6,635,527 B1 | * | 10/2003 | Greco et al. ................. 438/250 |

FOREIGN PATENT DOCUMENTS

| | | |
|---|---|---|
| DE | 198 38 435 A1 | 7/1999 |
| DE | 198 45 033 A1 | 4/2000 |
| EP | 0 771 022 A2 | 5/1997 |
| EP | 0 800 217 A1 | 10/1997 |
| EP | 0 975 018 A1 | 1/2000 |

\* cited by examiner

*Primary Examiner*—Tom Thomas
*Assistant Examiner*—José R. Diaz
(74) *Attorney, Agent, or Firm*—Laurence A. Greenberg; Werner H. Stemer; Ralph E. Locher

(57) ABSTRACT

A thin lower electrode layer having an optimally protected capacitor dielectric is produced and structured. A conventional metallization layer for strip conductors is placed thereon as an upper electrode and structured. The capacitor dielectric can be deposited on a very even, preferably metallic surface (e.g. preferably TiN), sealed by a thin, preferably metallic layer (e.g. TiN) and protected so that is does not become thinned or damaged by other process steps.

2 Claims, 5 Drawing Sheets

SEMICONDUCTOR COMPONENT AND FABRICATION METHOD

CROSS-REFERENCE TO RELATED APPLICATION

This application is a continuation of copending International Application No. PCT/DE01/00465, filed Feb. 7, 2001, which designated the United States and was not published in English.

BACKGROUND OF THE INVENTION

Field of the Invention

The present invention relates to a semiconductor component having an MIM capacitor and to an associated fabrication method.

To produce integrated electronic circuits, integrated passive components such as resistors, inductors and capacitors are also needed. For many applications, integrated capacitors need to have series resistances and losses whose magnitudes are as negligible as possible, while having a low area requirement and a low coupling to the substrate. The demand for low series resistances can be met ideally by using metal-insulator-metal (MIM) capacitors. If the metallization planes and intermetal dielectrics normally present in a multilayer metallization are used, capacitors with a very small specific capacitance per unit area (typically below 0.1 fF/$\mu$m$^2$) and relatively high tolerances above 20% can be produced. For optimized MIM capacitors, a separate insulating layer and usually a separate thin top metal electrode are generally used.

When integrating an MIM capacitor into a fabrication process for an integrated circuit, there are fundamentally two problems. The process cycle and to some extent also the layer sequence are significantly changed to some extent in the case of the usual methods. The differences between the fabrication methods for components with an integrated MIM capacitor and without an MIM capacitor result in different properties for the metallization system, particularly as regards reliability of the circuit. It is also difficult to achieve high specific capacitance per unit area values for the MIM capacitor, since reliability and tolerance problems quickly arise when using relatively thin capacitor dielectrics. The reason for this is that the typical granular structure of the bottom electrode, which is normally AlCu or AlSiCu, results in that the electrode has a relatively rough surface which can even change in the rest of the process cycle. In addition, with the normal method, the surface is subjected to a series of process steps that can impair the surface quality further. Following deposition and before the top electrode is applied, the capacitor dielectrics are also subjected to process steps which can adversely affect their surface or their layer property.

U.S. Pat. No. 5,391,905 describes an integrated circuit and an associated method for fabricating the circuit, where a top electrode made of polysilicon for a capacitor is deposited together with a contact electrode for a transistor after a bottom electrode made of polysilicon for the capacitor and a capacitor dielectric have been produced.

Published, Non-Prosecuted German Patent Application DE 198 38 435 A1 describes a method for fabricating a semiconductor memory where a bottom capacitor electrode made of polysilicon is deposited into an opening in an insulating film.

SUMMARY OF THE INVENTION

It is accordingly an object of the invention to provide a semiconductor component and a fabrication method which overcome the above-mentioned disadvantages of the prior art devices and methods of this general type, which can easily be fabricated using conventional fabrication processes and in which the difficulties specified in the introduction are circumvented.

With the foregoing and other objects in view there is provided, in accordance with the invention, a semiconductor component. The semiconductor component contains a topside for making electrical contact, and a capacitor having a bottom electrode, a top electrode disposed closer to the topside than the bottom electrode, and a capacitor dielectric. The bottom electrode is formed by a specially provided metal electrode layer, and the top electrode is formed by a metallization plane for interconnects.

In the case of the inventive component, the capacitor dielectric and the thin top electrode are not, as is usual, applied to a relatively thick, rough metal layer originating from the standard metallization, but rather, conversely, an optimum thin bottom electrode layer with an optimally protected capacitor dielectric is first produced and structured. A metallization plane is applied thereto and structured, which metallization plane is provided for the normal interconnects and electrical connections of further integrated components. The capacitor dielectric can therefore be deposited on a very smooth, preferably metal (bottom electrode), surface (e.g. TiN) and, following deposition, can be sealed and protected by a thin, likewise preferably metal, layer (e.g. TiN), so that it is not thinned or damaged by other process steps. A particular advantage is that the additionally provided layer which forms the bottom electrode of the MIM capacitor is provided only in the region of the MIM capacitor, which results in that the rest of the layer configuration is not altered as compared with a configuration without a capacitor. The inventive component therefore allows a capacitor with small manufacturing tolerances to be integrated using a normal fabrication process without the previous semiconductor structures of a configuration without a capacitor needing to be changed.

In accordance with an added feature of the invention, a further dielectric is provided and covers and forms the topside. The further dielectric is a passivation layer or an intermetal dielectric layer. The capacitor dielectric that is disposed between the bottom electrode and the top electrode has a relatively high dielectric constant.

In accordance with an additional feature of the invention, the capacitor dielectric is formed of $Si_3N_4$ or tantalum oxide.

In accordance with a further feature of the invention, the top electrode has a given surface and the bottom electrode has a surface having a lower roughness than the given surface of the top electrode. The capacitor dielectric covers the surface of the bottom electrode.

With the foregoing and other objects in view there is provided, in accordance with the invention, a method for fabricating a semiconductor component having an integrated capacitor. The method includes applying a passivation to a topside of a component structure, depositing a metal layer onto the passivation and the metal layer functions as a bottom electrode of the integrated capacitor, depositing a dielectric layer on the metal layer, and depositing a metallization plane on the dielectric layer. The metallization plane is structured to form interconnects and/or contact areas, and to form a top electrode of the integrated capacitor. At least one covering dielectric is deposited and contact holes for at least one of the bottom electrode and the top electrode are formed in the covering dielectric. The contact holes are then filled with an electrically conductive material.

In accordance with an added mode of the invention, there are the steps of producing further contact holes in the passivation before performing the step of depositing the metal layer, and filling the further contact hoes with contact hole fillings formed from an electrically conductive material for producing an electrically conductive connection to a contact area situated below the passivation and for electrically connecting the bottom electrode. The metal layer is deposited above the contact hole fillings during the step of depositing the metal layer.

Other features which are considered as characteristic for the invention are set forth in the appended claims.

Although the invention is illustrated and described herein as embodied in a semiconductor component and a fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
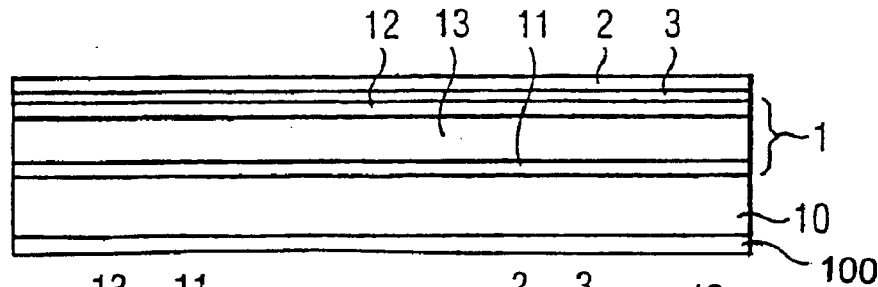
FIGS. 1A–1F are diagrammatic, sectional views showing steps for the construction of a first embodiment of a semiconductor component according to the prior art.
Figure 1B:
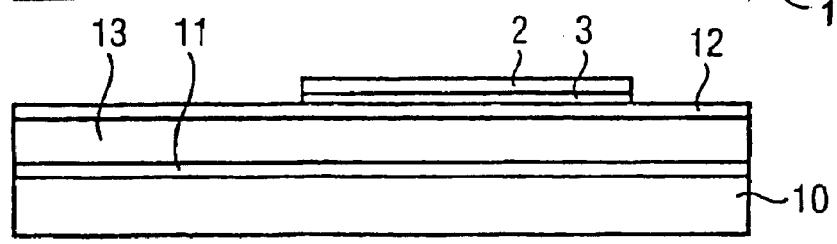
Figure 1C:
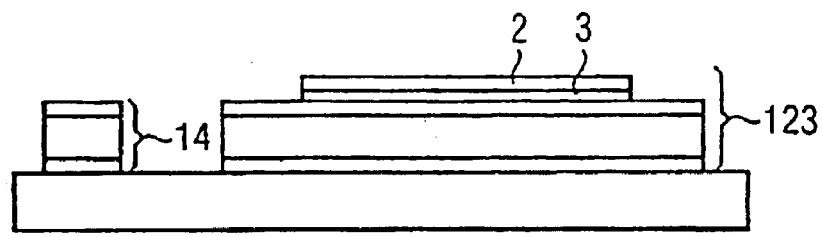
Figure 1D:
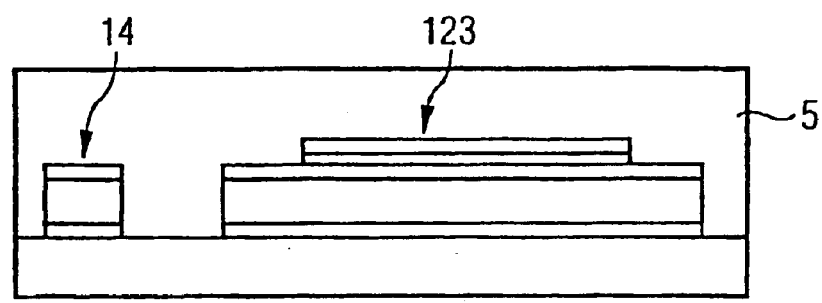
Figure 1E:
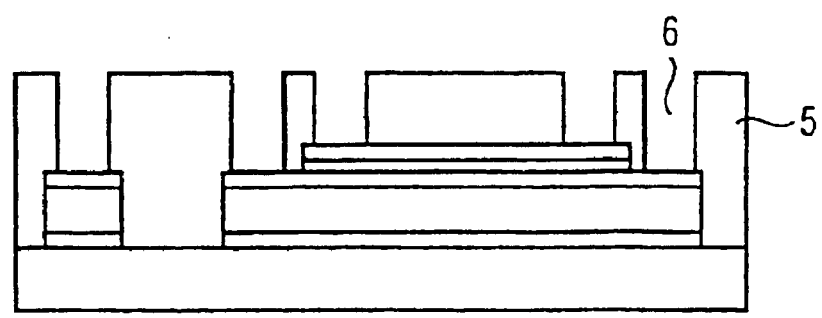
Figure 1F:
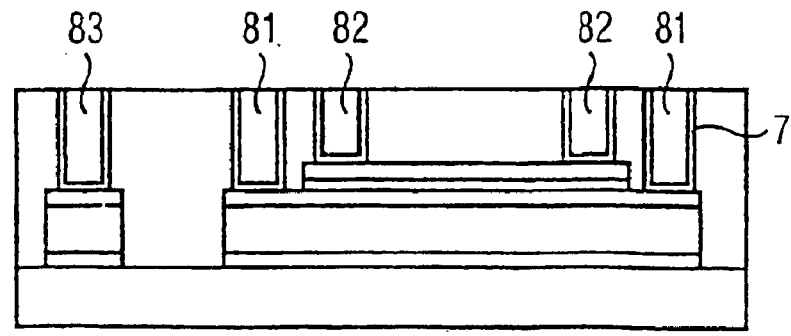
Figure 2A:
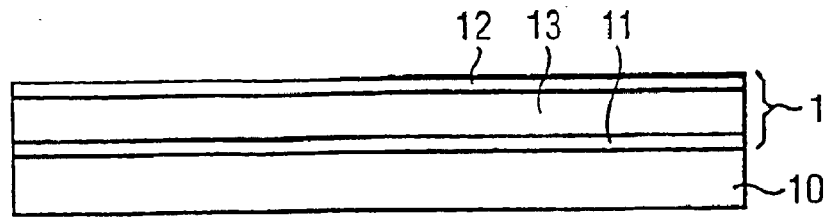
FIGS. 2A–2F are diagrammatic, sectional views showing steps for the construction of a second embodiment of the semiconductor component according to the prior art.
Figure 2B:
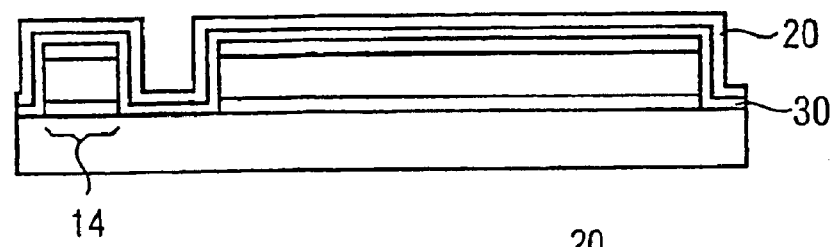
Figure 2C:
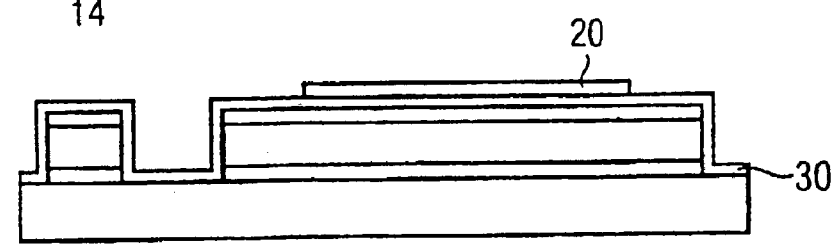
Figure 2D:
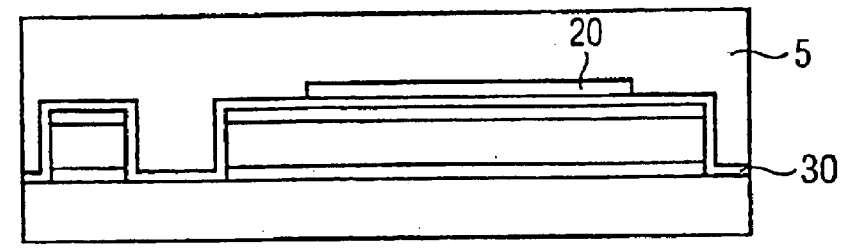
Figure 2E:
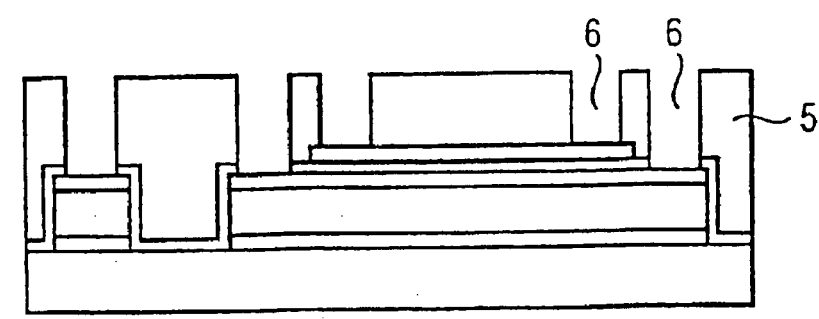
Figure 2F:
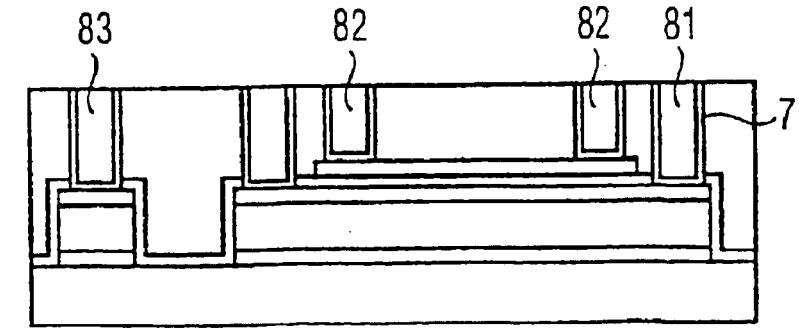

Referring now to the figures of the drawing in detail and first, particularly, to FIGS. 1A–1F thereof, there is shown various intermediate product stage of a known fabrication method. In the case of the layer structure shown in cross section in FIG. 1A, right at the bottom, there is a passivation 10 which can be applied to a semiconductor layer structure 100 as an insulating layer, for example, or can be a top dielectric layer of a metallization with intermetal dielectrics which contain one or more metallization planes. In this example, a standard metallization applied thereto has a sandwich structure with a bottom electrically conductive layer 11 and a top electrically conductive layer 12 which have an insulating layer 13 situated between them. The top electrically conductive layer 12 is used as the bottom electrode of the MIM capacitor. Onto the layer 12, a capacitor dielectric 3 is deposited (e.g. a plasma nitride with a thickness of less than 0.1 µm) followed by a further thin metal layer 2 used as the top electrode 2 of the capacitor (e.g. TiN with a thickness of approximately up to 0.1 µm). A suitable mask is used to structure the top electrode 2, with either the capacitor dielectric 3 or the electrically conductive layer 12 below that being used as an etching stop layer. The result of the step is shown in FIG. 1B. This is followed, in line with FIG. 1C, by structuring of the standard metallization 1 to form a portion for the MIM capacitor 123 and a portion for the interconnect 14. FIG. 1D shows that a topside of the structure is embedded into a covering dielectric 5. In line with FIG. 1E, contact holes 6 provided for electrical connection of the metallizations are etched into the dielectric 5. The contact holes 6 are filled in a manner that is known per se, so that the structure shown in FIG. 1F is produced. A base metal 7 (usually Ti/TiN) can also first be deposited in the contact holes 6 before the actual contact hole filling (typically tungsten) is introduced into the contact holes 6. This produces the electrical connections for the bottom capacitor electrode (contact hole fillings 81), for the top capacitor electrode (contact hole fillings 82) and for the interconnects (contact hole fillings 83).

An alternative to the known method is shown in FIGS. 2A to 2F. Again, starting from the standard metallization 1, the metallization is now structured in line with FIG. 2B before the top capacitor electrode is applied. Only when the interconnects 14 have been structured are the capacitor dielectric 30 and the thin electrically conductive layer 20 provided for the top capacitor electrode applied. When the top conductive layer 20 has been structured, the capacitor dielectric 30 also remains in the region of the interconnects 14 on the topside of the structure, which results in that the interconnects 14 are surrounded by the dielectric 30 on three sides. In line with FIGS. 2D to 2F, the covering dielectric 5 is then applied, the contact holes 6 are etched and the base metal and the contact hole fillings are introduced into the holes, in line with the variant shown in FIGS. 1D to 1F. When etching the contact holes 6 in line with FIG. 2E, it is also necessary to etch through the capacitor dielectric 30. If the capacitor dielectric 30 is completely removed from the rest of the surfaces at the same time as the top capacitor electrode is structured, then there is the risk that the normally applied top antireflective layer (usually TiN) will also be removed from them. The antireflective layer, the actual interconnect material (e.g. AlCu) and the base metal situated below that form a sandwich structure whose integrity is crucial for the electromigration strength of the metallization system. The etching process destroys or at least damages the sandwich structure. In the region outside the MIM capacitor that is to be produced, the capacitor dielectric is therefore not removed from the surfaces of the conductive layers (generally metal layers) until the contact holes 6 are produced.

Figure 3A:
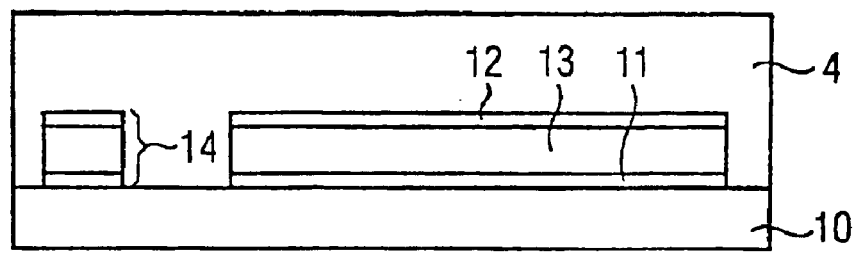
FIGS. 3A–3E are diagrammatic, sectional views showing steps for the construction of a third embodiment of the semiconductor component according to the prior art.
Figure 3B:
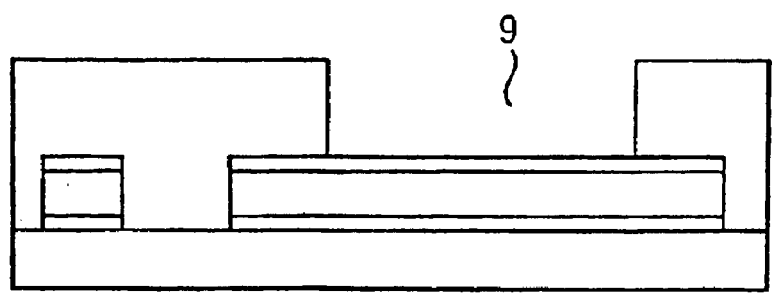
Figure 3C:
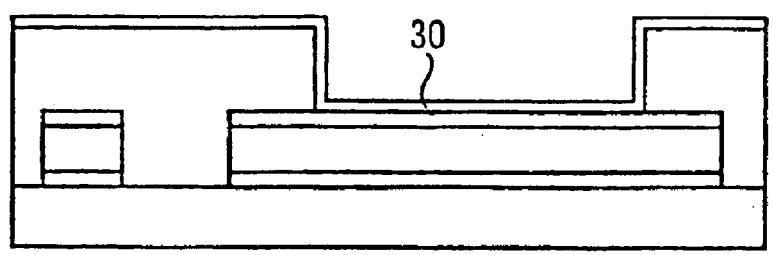
Figure 3D:
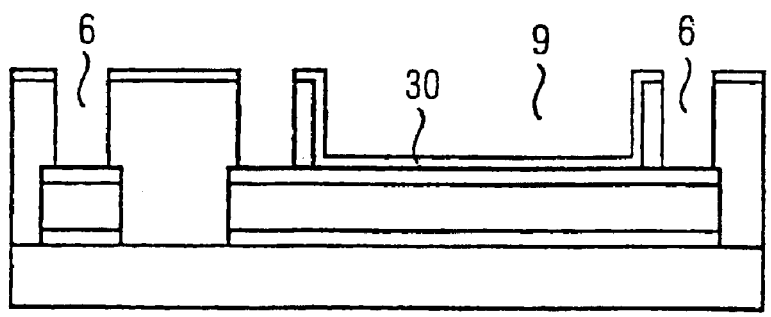
Figure 3E:
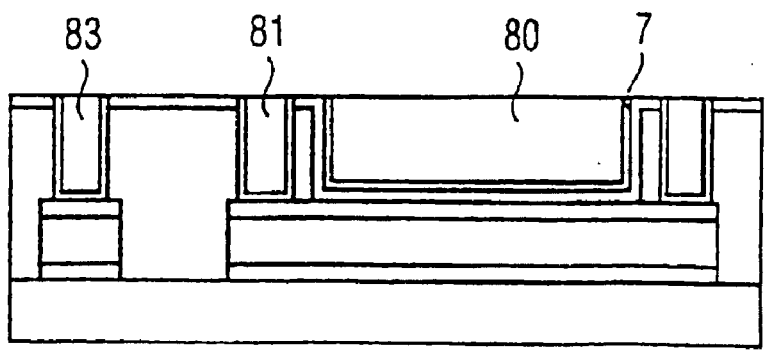

Another option for producing MIM capacitors is, in line with FIGS. 3A to 3E, to follow the application of an intermetal dielectric 4 to the structured standard metallization with the production of a cutout 9 in the dielectric 4, shown in FIG. 3B, as a window above the top conductive layer 12. The capacitor dielectric 30 is then deposited on the surface and into the cutout 9, in line with FIG. 3C. The contact holes 6 are then etched in line with FIG. 3D. When the contact hole fillings are introduced after the base metallization 7 has possibly also been applied, the electrical connections for the bottom capacitor electrode (the contact hole filling 81) and for the interconnect (the contact hole filling 83) are then produced. The cutout 9 is likewise filled with the metal for contact hole filling. This produces a top capacitor electrode 80. Drawbacks of this method are that, before the base metalization is deposited, a cleaning step needs to be performed in order to improve the contact resistances. The cleaning step thins the capacitor dielectric exposed at this time and possibly also damaging it, and that the capacitor dielectric is retained as an additional layer in the layer structure with the intermetal dielectric 4 and can have an adverse effect on the properties of the metallization system (stress, barrier effect for $H_2$ diffusion)

FIGS. 4A to 4F and 5A to 5F show cross-sectional views of intermediate products after various steps in fabrication methods according to the invention.

Figure 4A:
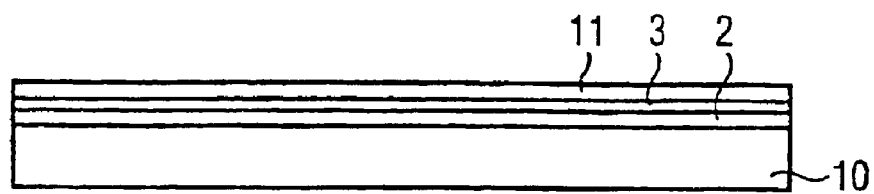
FIGS. 4A–4F are diagrammatic, sectional views showing steps for the construction of a first embodiment of the semiconductor component according to the invention.

As FIG. 4A shows, the thin conductive layer 2, preferably a metal, is first deposited on the insulating passivation 10 (this can be an intermediate oxide or an intermetal dielectric) as a bottom electrode 2. As soon as possible thereafter, an electrically insulating layer 3 is applied thereto as a capacitor dielectric 3. The capacitor dielectric 3 likewise has the smallest possible layer thickness and is preferably made of a material with a high dielectric constant (e.g. $Si_3N_4$ or tantalum oxide). Finally, a conductive top layer 11 can be applied to seal the dielectric 3 and is a top electrode 11 of the capacitor that is to be produced. Quickly sealing the capacitor dielectric 3 with the conductive layer 11 protects the dielectric 3 from thinning and from other damage resulting from further process steps. The layers 2, 3, 11 can be produced using normal method steps such as sputtering, vapor deposition, chemical vapor deposition (CVD), physical vapor deposition (PVD) or electrodeposition.

Figure 4B:
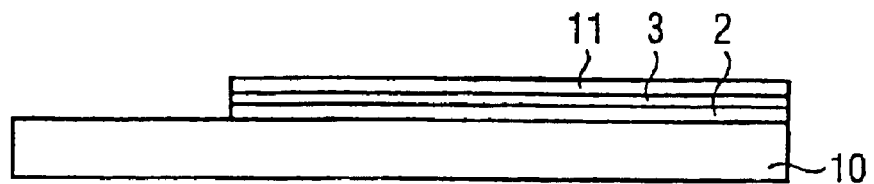

In line with FIG. 4B, the deposited layer sequence 2, 3, 11 is then structured using a photographic technique and a suitable etching step. Following removal of the photoresist used in this context and any necessary cleaning, the processing as customary in a multilayer metallization process continues with deposition of a metallization layer (e.g. interconnect metal and antireflective layer) and the structuring thereof.

Figure 4C:
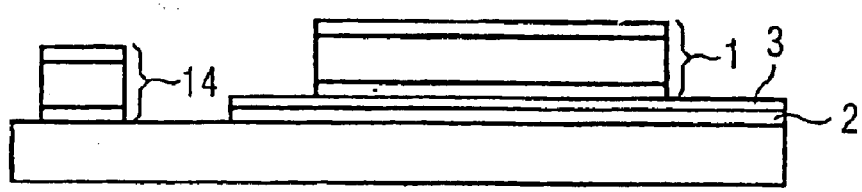
Figure 4D:
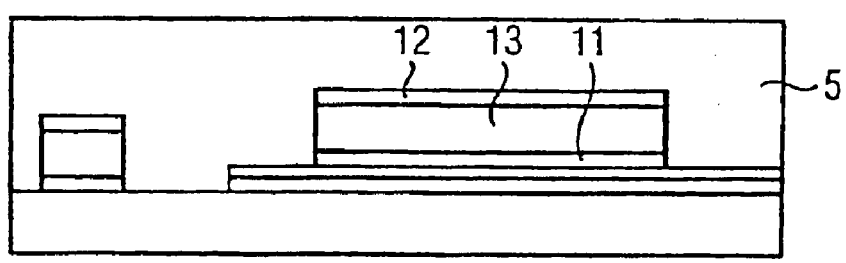

FIG. 4C shows such a structure with a standard metallization 1 and an interconnect 14 structured therein. The top electrode 11 of the capacitor is now part of the standard metallization 1. In this example shown in FIG. 4D, more extensive structuring exposes part of the capacitor dielectric 3. In this case too, the standard metallization 1 contains, as an example, a sandwich structure containing the conductive layer 11, a top conductive layer 12 and an insulating layer 13 disposed between them. The structure is covered with the dielectric 5 in which the contact holes 6 are produced in line with FIG. 4E. In the region of the contact holes 6 provided for the bottom electrode, the capacitor dielectric 3 exposed there in a prior structuring step is etched through. In line with FIG. 4F, the contact hole fillings produced on the base metal 7 in accordance with the prior art are used to produce the electrical connections for the bottom electrode (the contact hole filling 84), the top electrode (the contact hole fillings 85) and the interconnects (contact hole fillings 83). The contact holes 6 can each be individual cylindrical openings. As shown by the illustration of the cross sections in FIGS. 4E and 4F, a circular annular opening disposed along the edge of the respective capacitor electrode can also be produced, however.

Figure 4E:
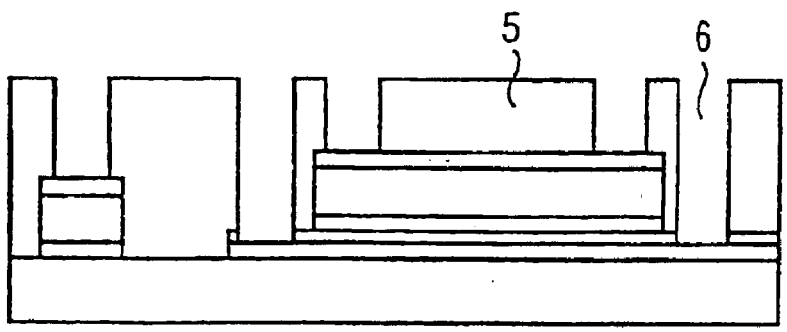
Figure 4F:
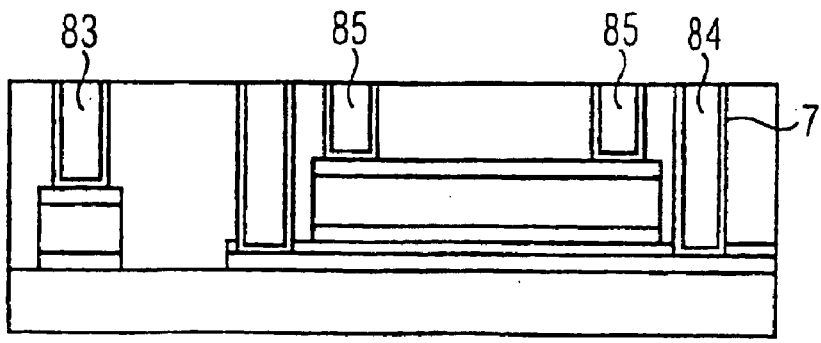

The structuring of the metallizations applied above the capacitor dielectric 3 in order to obtain the structure shown in FIG. 4C can also entail the capacitor dielectric 3 even then being removed from the regions of the surface of the bottom electrode 2 which are at the side of that region above which the top electrode 11 of the finished capacitor is disposed. When producing the contact holes 6 as shown in FIG. 4E, the dielectric 5 can then be etched out directly on that surface of the bottom electrode 2 which is not covered by the capacitor dielectric 3. This simplifies etching of the contact holes 6, since it is only necessary to etch through one dielectric 5 and not additionally through the capacitor dielectric 3 that is preferably made of a material having a relatively high dielectric constant.

Figure 5A:
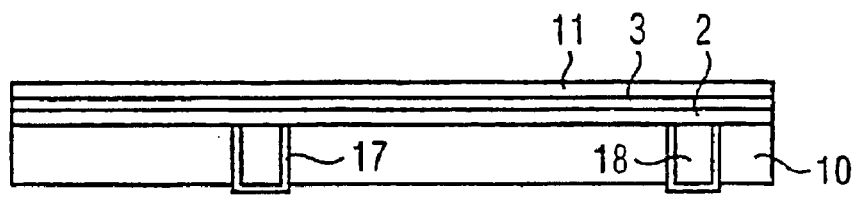
FIGS. 5A–5F are diagrammatic, sectional views of the construction of a second embodiment of the semiconductor component according to the invention.
Figure 5B:
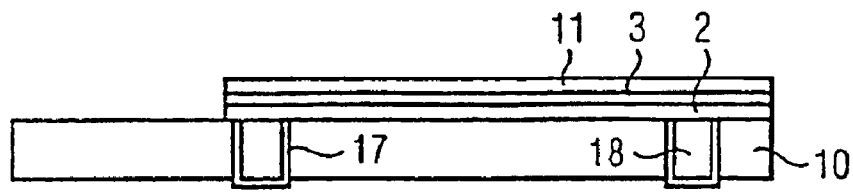
Figure 5C:
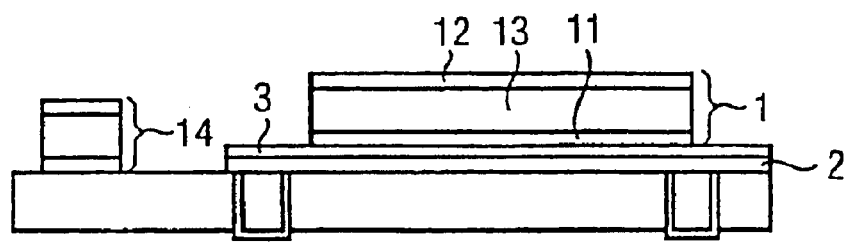
Figure 5D:
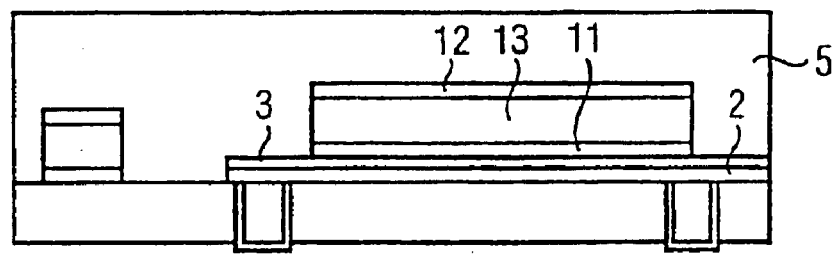
Figure 5E:
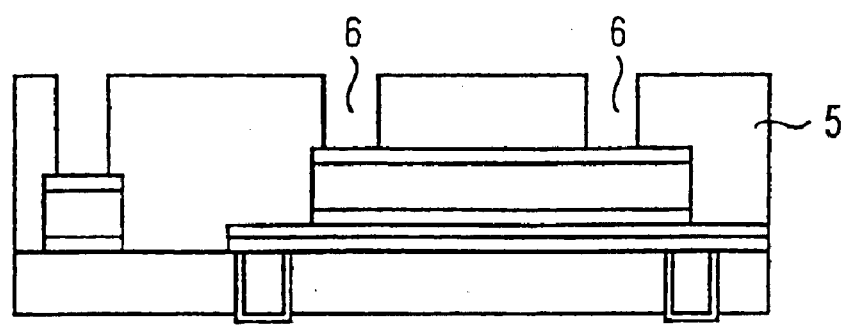
Figure 5F:
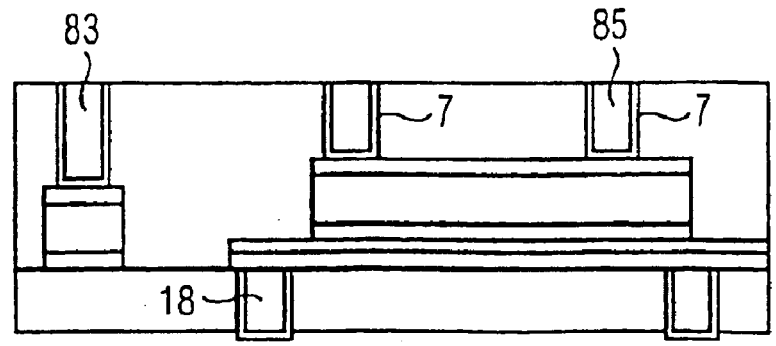

In the embodiment shown in FIGS. 5A to 5F, production of the connection for the bottom electrode 2 differs from that in the exemplary embodiment already described. FIG. 5A shows that, in the case of the embodiment, the contact holes in the passivation 10 which are filled with a contact hole filling 18, preferably on a base metal 17, before the bottom electrode 2 is deposited are provided for connecting the bottom electrode 2. The rest of the method steps are based on the exemplary embodiment in FIGS. 4A–4F, but with the difference that, in line with FIG. 5E, no contact holes need to be produced in the dielectric for the bottom electrode 2 of the capacitor.

I claim:

1. A method for fabricating a semiconductor component having an integrated capacitor, which comprises the steps of:

applying a passivation to a topside of a component structure;

forming a bottom electrode by depositing a specially provided metal layer of TiN onto the passivation, the metal layer functioning as the bottom electrode of the integrated capacitor;

removing the metal layer except for a portion forming the bottom electrode;

depositing a dielectric layer of $Si_3N_4$ with a relatively high dielectric constant on the metal layer;

depositing a metallization plane on the dielectric layer;

structuring the metallization plane to form at least one of interconnects and contact areas, and forming a top electrode of the integrated capacitor as a part of the metallization;

forming the bottom electrode with a surface having less roughness than a surface of the top electrode;

depositing the metal layer before depositing the metallization plane;

depositing at least one covering dielectric;

forming contact holes for at least one of the bottom electrode and the top electrode in the covering dielectric;

filling the contact holes with an electrically conductive material;

producing further contact holes in the passivation before performing the step of depositing the metal layer; and filling the further contact holes with contact hole fillings formed from an electrically conductive material for producing an electrically conductive connection to a contact area situated below the passivation and for electrically connecting the bottom electrode, the metal layer being deposited above the contact hole fillings during the step of depositing the metal layer and being produced independently of further interconnects except for the electrical connecting of the bottom electrode, being located in the same metallization plane.

2. The method according to claim 1, which further comprises forming the contact holes for at least one of the bottom electrode and the top electrode through the top electrode and the dielectric, and applying the contact hole fillings to produce electrical connections for the bottom electrode from above the bottom electrode.

* * * * *